(12) United States Patent
Huang

(10) Patent No.: US 11,545,652 B2
(45) Date of Patent: Jan. 3, 2023

(54) ORGANIC LIGHT-EMITTING DISPLAY PANEL AND MANUFACTURING METHOD THEREOF

(71) Applicant: SEEYA OPTRONICS CO., LTD., Shanghai (CN)

(72) Inventor: Zhongshou Huang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 308 days.

(21) Appl. No.: 17/096,024

(22) Filed: Nov. 12, 2020

(65) Prior Publication Data

US 2021/0367216 A1    Nov. 25, 2021

(30) Foreign Application Priority Data

May 25, 2020    (CN) .......................... 202010451438.7

(51) Int. Cl.
    *H01L 51/56*      (2006.01)
    *H01L 27/32*      (2006.01)
    (Continued)

(52) U.S. Cl.
    CPC .......... *H01L 51/56* (2013.01); *H01L 27/3246* (2013.01); *H01L 51/0048* (2013.01);
    (Continued)

(58) Field of Classification Search
    CPC . H01L 51/56; H01L 27/3246; H01L 51/0048; H01L 51/0094; H01L 51/5064; H01L 51/5271; H01L 51/5284; H01L 51/5228; H01L 27/3279; H01L 51/5221; H01L 27/3281
See application file for complete search history.

(56) References Cited

U.S. PATENT DOCUMENTS 9,647,229 B2 *    5/2017    Nakazawa ............ H01L 27/322
9,978,828 B2 *    5/2018    Kim ....................... H01L 51/504
(Continued)

FOREIGN PATENT DOCUMENTS

CN      103545345      1/2014
CN      103715231      4/2014
(Continued)

OTHER PUBLICATIONS

Extended European Search Report dated Jun. 18, 2021 in corresponding European Application No. 21151628.1.
(Continued)

*Primary Examiner* — Kevin Quarterman
(74) *Attorney, Agent, or Firm* — Duane Morris LLP

(57) ABSTRACT

An OLED panel includes a substrate, a first electrode layer, a pixel definition layer, a light-emitting layer, a second electrode layer, a conductive wall, a planarization layer, and a third electrode layer. The planarization layer is disposed on a surface of the second electrode layer facing away from the (Continued)

substrate and includes second openings; the conductive wall is disposed in the second openings, is made of an elastic material, and includes peaks and valleys spaced apart from each other; the third electrode layer is disposed on a side of the conductive wall facing away from the substrate and is in contact with the peaks.

19 Claims, 9 Drawing Sheets

(51) Int. Cl.
  *H01L 51/00*    (2006.01)
  *H01L 51/50*    (2006.01)
  *H01L 51/52*    (2006.01)

(52) U.S. Cl.
  CPC ...... *H01L 51/0094* (2013.01); *H01L 51/5064* (2013.01); *H01L 51/5271* (2013.01)

(56) References Cited

U.S. PATENT DOCUMENTS

| | | | |
|---|---|---|---|
| 10,411,189 B2* | 9/2019 | Kong | H01L 51/5228 |
| 11,309,355 B2* | 4/2022 | Lin | H01L 27/3211 |
| 2005/0212413 A1 | 9/2005 | Matsuura et al. | |
| 2011/0031500 A1 | 2/2011 | Suh | |
| 2016/0181566 A1 | 6/2016 | Wang | |

FOREIGN PATENT DOCUMENTS

| | | |
|---|---|---|
| CN | 106129102 | 11/2016 |
| CN | 107293573 | 10/2017 |
| CN | 107342372 | 11/2017 |
| CN | 107644894 | 1/2018 |
| CN | 107799564 | 3/2018 |
| CN | 108417609 | 8/2018 |
| CN | 109065751 | 12/2018 |
| CN | 109728065 | 5/2019 |
| CN | 110112194 | 8/2019 |
| CN | 110911583 | 3/2020 |
| CN | 111599936 | 8/2020 |
| JP | 2002033198 | 1/2002 |
| KR | 20050024033 | 3/2005 |
| TW | 201324896 | 6/2013 |

OTHER PUBLICATIONS

Chinese Office Action dated Mar. 8, 2022 in corresponding Chinese Patent Application No. 202010451438.7.

* cited by examiner

ORGANIC LIGHT-EMITTING DISPLAY PANEL AND MANUFACTURING METHOD THEREOF

CROSS-REFERENCE TO RELATED APPLICATION(S)

This application claims priority to Chinese Patent Application No. 202010451438.7 filed on May 25, 2020, which is incorporated herein by reference in its entirety.

TECHNICAL FIELD

The present disclosure relates to display technologies and, in particular, to an organic light-emitting display (OLED) panel and a manufacturing method thereof.

BACKGROUND

In recent years, OLED panels have gradually become the mainstream of display screen of mobile communication terminal s. The OLED panel includes a plurality of sub-pixels arranged in an array. Each sub-pixel includes a pixel driving circuit and a light-emitting element electrically connected to the pixel driving circuit.

In the related art, each light-emitting element includes multiple layers stacked up in sequence: an anode, a hole transport layer, a light-emitting layer, an electron transport layer and a cathode. In order to achieve high sub-pixel density in a display panel or to manufacture a display panel on a tiny silicon chip, a convenient approach is to continuously deposit the hole transport layer, the light-emitting layer, the electron transport layer and the cathode without using shadow mask. The separation of the plurality of sub-pixels is realized by a pixel definition layer. Furthermore, to prevent or reduce lateral charge diffusion in the hole transport layer, some unique structures, such as sidewalls with inversed slope, are created in the pixel definition layer to disrupt the continuity of the hole transport layer.

The thickness of the cathode film is generally made relatively thin to allow OLED light to pass through. Uneven surface topology of the OLED panel is another cause to make the cathode film even thinner at the sidewalls or slopes of the pixel definition layer. Large resistance of cathode film is therefore inevitable with ordinary design. External supplied voltage for OLED bias will be attenuated across the entire OLED panel, which is "voltage drop" mechanism similar to what is frequently observed along power supply line. It is therefore a primary objective of this disclosure to provide a solution to overcome the voltage drop on the cathode film.

SUMMARY

An OLED panel and a manufacturing method thereof are provided in embodiments of the present disclosure to enable a conductive wall to be in close contact with a third electrode layer through peaks at various positions and minimize the non-uniformity of light emission caused by the voltage drop on the cathode film.

In a first aspect, OLED panel is provided in the embodiments of the present disclosure and includes a substrate, a first electrode layer, a pixel definition layer, a light-emitting layer, a second electrode layer, a conductive wall, a planarization layer, and a third electrode layer.

The first electrode layer includes a plurality of first electrodes and is disposed on the substrate; the pixel definition layer is disposed on a side of the first electrode layer facing away from the substrate and includes a plurality of first openings, each of the plurality of first openings exposes part of a respective one of the plurality of first electrodes; the light-emitting layer is disposed on a side of the plurality of first electrodes facing away from the substrate; and the second electrode layer is disposed on a side of the light-emitting layer facing away from the substrate.

The planarization layer is disposed on a surface of the second electrode layer facing away from the substrate and includes a plurality of second openings; the conductive wall is disposed in the plurality of second openings, is made of an elastic material, and includes peaks and valleys spaced apart from each other; and the third electrode layer is disposed on a side of the conductive wall facing away from the substrate and is in contact with the peaks.

Each of the peaks has a height of H1, and each of the valleys has a height of H2, and the planarization layer has a height of H3, where H2<H3<H1; and a vertical projection of the conductive wall on the substrate and a vertical projection of the third electrode layer on the substrate each overlap a vertical projection of the pixel definition layer on the substrate.

In a second aspect, a manufacturing method of an OLED panel is provide in the embodiments of the present disclosure and includes steps described below.

A first electrode layer, a pixel definition layer, a light-emitting layer, and a second electrode layer are stacked up in sequence on a substrate, where the first electrode layer includes a plurality of first electrodes, the pixel definition layer includes a plurality of first opening structures, and each of the plurality of first opening structures exposes part of a respective one of the plurality of first electrodes.

A conductive wall is formed on the second electrode layer, where the conductive wall is made of an elastic material and includes peaks and valleys spaced apart from each other.

A planarization layer is formed; where the planarization layer includes a plurality of second openings, and the conductive wall is disposed in the plurality of second openings.

A third electrode layer is formed, where the third electrode layer is in contact with the peaks of the conductive wall.

A vertical projection of the conductive wall on the substrate and a vertical projection of the third electrode layer on the substrate each overlap a vertical projection of the pixel definition layer on the substrate; and each of the peaks has a height of H1, each of the valleys has a height of H2, and the planarization layer has a height of H3, where H2<H3<H1.

According to the OLED panel and the manufacturing method thereof in the embodiments of the present disclosure, the first electrode layer, the pixel definition layer, the light-emitting layer, the second electrode layer, the conductive wall, the planarization layer, and the third electrode layer are stacked up in sequence on the substrate, the planarization layer includes the plurality of second openings, the conductive wall is disposed in the plurality of second openings, and the second electrode layer is electrically connected to the third electrode layer through the conductive wall. As results, the total resistance of the second electrode, i.e. the cathode of the OLED, is reduced significantly, and the voltage drop on cathode and associated display image artifacts can be minimized to a level below what a human can conceive. Furthermore, the conductive wall is provided with the peaks and the valleys at intervals, ensuring lateral circulation of an airflow inside the conductive wall, and electrical contact between the conductive wall and the third electrode layer through the peaks at various positions.

The OLED panel provided by the embodiments of the present disclosure has an integrated OLED panel structure, that is, film structures of the OLED panel are manufactured in sequence on one side of the substrate, and there is no need to align two substrates for encapsulation, so that a second electrode can be closely connected to the conductive wall to obtain a reliable electrical connection at an atomic or molecular level.

DETAILED DESCRIPTION

Figure 1:
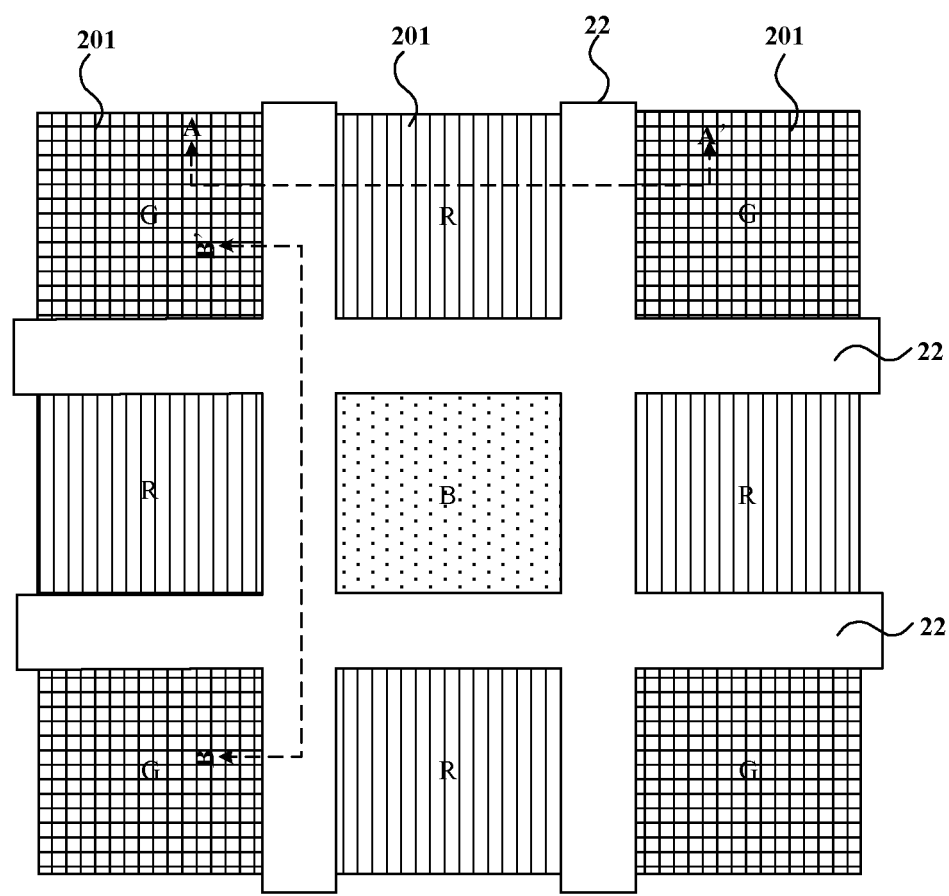
FIG. 1 shows a plane view of an OLED panel according to embodiments of the present disclosure.

Hereinafter the present disclosure is further described in detail in conjunction with the drawings and embodiments. It is to be understood that the embodiments set forth below are intended to illustrate and not to limit the present disclosure. Additionally, it is to be noted that for ease of description, only part, not all, of the structures related to the present disclosure are illustrated in the drawings.

Figure 2:
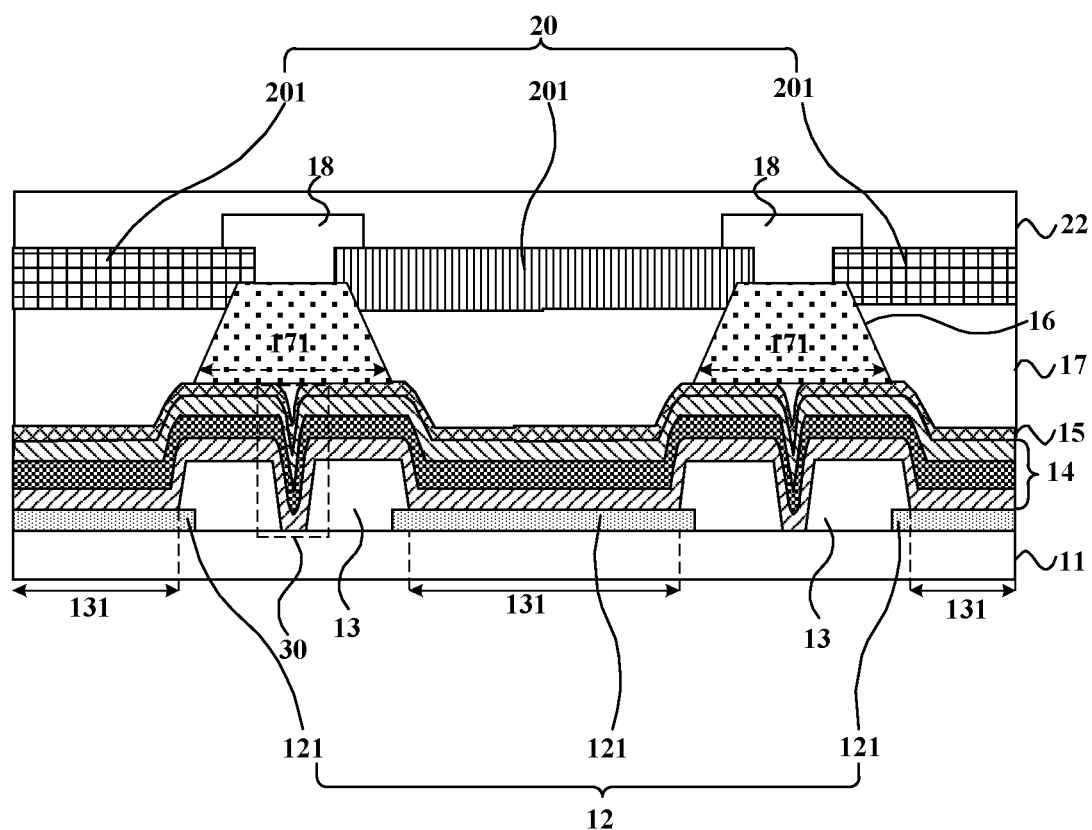
FIG. 2 shows a cross-sectional view of the OLED panel illustrated in FIG. 1 taken along a cross-section AN.
Figure 3:
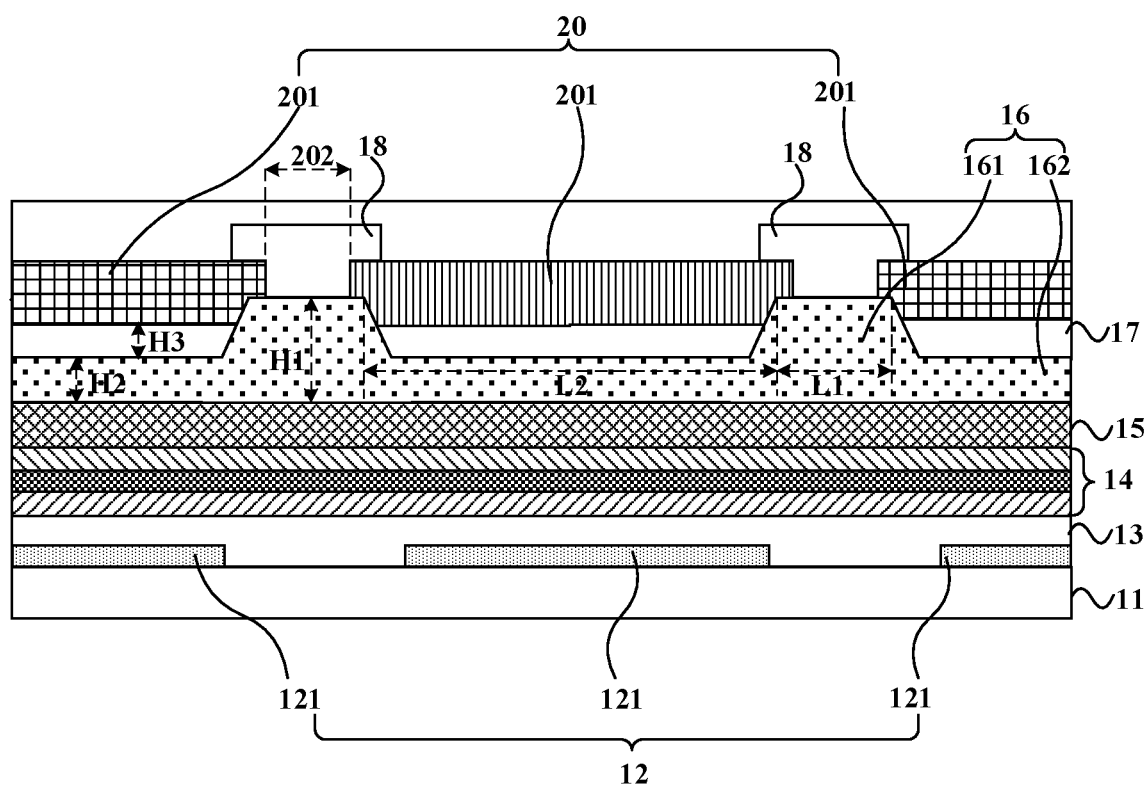
FIG. 3 shows a cross-sectional view of the OLED panel illustrated in FIG. 1 taken along a cross-section BB'.

FIG. 1 shows a plane view of an OLED panel according to embodiments of the present disclosure, its cross-sectional view is illustrated in FIG. 2 along a cross-section AN, its cross-sectional view is illustrated in FIG. 3 along a cross-section BB'. As shown in FIGS. 1, 2 and 3, the OLED panel includes a substrate 11, a first electrode layer 12, a pixel definition layer 13, a light-emitting layer 14, a second electrode layer 15, a conductive wall 16, a planarization layer 17, and a third electrode layer 18. The first electrode layer 12 includes a plurality of first electrodes 121 and is disposed on the substrate 11; the pixel definition layer 13 is disposed on a side of the first electrode layer 12 facing away from the substrate 11 and includes a plurality of first openings 131, and the first opening 131 exposes part of the first electrode 121; the light-emitting layer 14 is disposed on a side of the plurality of first electrodes 121 facing away from the substrate 11; and the second electrode layer 15 is disposed on a side of the light-emitting layer 14 facing away from the substrate 11. The planarization layer 17 is disposed on a surface of the second electrode layer 15 facing away from the substrate 11 and includes a plurality of second openings 171; the conductive wall 16 is made of an elastic material and disposed in the plurality of second openings 171 and includes peaks 161 and valleys 162 spaced apart from each other; and the third electrode layer 18 is disposed on a side of the conductive wall 16 facing away from the substrate 11 and is in contact with the peaks 161. The peak 161 has a height of H1, and the valley 162 has a height of H2; a vertical projection of the conductive wall 16 on the substrate 11 and a vertical projection of the third electrode layer 18 on the substrate 11 each overlap a vertical projection of the pixel definition layer 13 on the substrate 11; and the planarization layer 17 has a height of H3, where H2<H3<H1.

In conjunction with FIGS. 1, 2 and 3, a position corresponding to the first opening 131 is a sub-pixel region, and the first electrode 121, the light-emitting layer 14, and the second electrode layer 15 in the sub-pixel region form a light-emitting element. The light-emitting layer 14 may include, for example, films such as a hole injection layer, a hole transport layer, a light-emitting layer, an electron transport layer, and an electron injection layer. To achieve a high sub-pixel density in a display panel or manufacture a display panel on a tiny silicon chip, the light-emitting layer 14 of the light-emitting element may be provided as an integral film layer, that is, the electron transport layer, the hole transport layer, the light-emitting layer, the electron injection layer, and the hole injection layer of all light-emitting elements are not interrupted and each film layer in the light-emitting element cross the pixel definition layer 13 between any two adjacent sub-pixels, thereby avoiding the use of a plurality of masks to separately evaporate various films of different light-emitting elements. Furthermore, to prevent or reduce lateral charge diffusion or lateral crosstalk in the hole injection layer or the hole transport layer, a groove structure 30 may also be provided on the pixel definition layer 13 between two adjacent sub-pixels to increase a transmission path of a leakage current in the two adjacent sub-pixel regions in the film layer such as the hole injection layer, thereby blocking a lateral leakage current and improving a display effect of the display panel.

It is to be noted that whether the groove structure 30 is provided at the pixel definition layer 13 is not limited in the embodiments of the present disclosure. The second electrode layer 15 crossing the pixel definition layer 13 is easy to break when the groove structure 30 is provided at the pixel definition layer 13. Therefore, the solution provided by the embodiments of the present disclosure is also applicable to the case where the groove structure 30 is provided at the pixel definition layer 13.

According to the embodiments of the present disclosure, the first electrode layer 12, the pixel definition layer 13, the light-emitting layer 14, the second electrode layer 15, the conductive wall 16, the planarization layer 17, and the third electrode layer 18 are stacked up in sequence on the substrate 11, and the second electrode layer 15 is electrically connected to the third electrode layer 18 through the conductive wall 16. On one hand, the problem of excessive resistance of the second electrode layer 15 since the second electrode layer 15 is relatively thin can be solved. On the other hand, if the second electrode layer 15 is interrupted at a position of the pixel definition layer 13, since the second electrode layer 15 may also be electrically connected to the third electrode layer 18 through the conductive wall 16, the problem of an increased voltage drop at the interrupted position of the second electrode layer 15 can also be avoided. In addition, since the conductive wall 16 includes the peaks 161 and the valleys 162 spaced apart from each other, lateral circulation of an airflow inside the conductive wall 16 is ensured while ensuring elasticity of the conductive wall 16, thereby enabling the conductive wall 16 to be in close contact with the third electrode layer 18 through the peaks 161 at various positions. A planarization layer is formed by coating process on the second electrode, so as to minimize height variations of OLEDs across the entire panel. The planarization layer in a liquid state before its solidification can laterally flow between adjacent sub-pixels through the valleys, so that a surface of the planarization layer facing away from the substrate is smooth at positions of different adjacent sub-pixels. The OLED panel provided by the embodiments of the present disclosure has an integrated display panel structure, that is, film structures of the OLED panel are stacked up in sequence on one side of the substrate, and a mechanical alignment of two substrates can be omitted during encapsulation, so that a second electrode layer can be closely connected to the conductive wall to obtain a reliable electrical connection at an atomic or molecular level.

Figure 4:
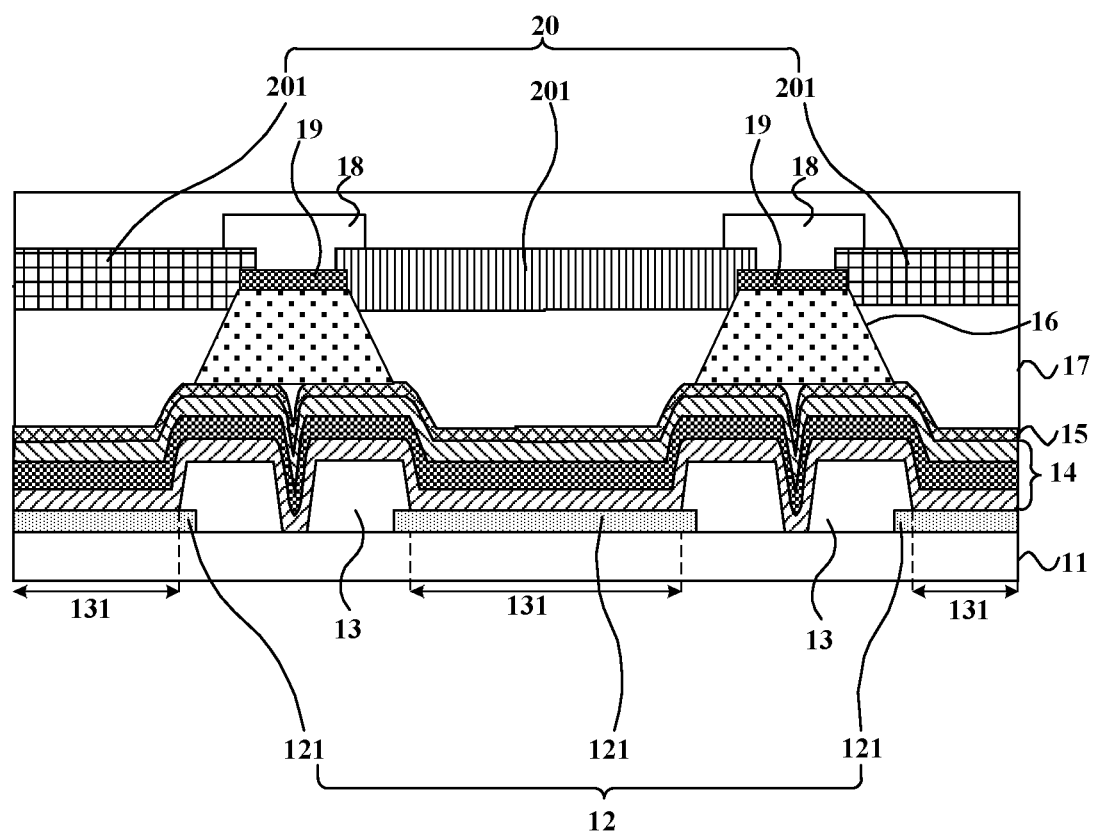
FIG. 4 shows a cross-sectional view of another OLED panel according to embodiments of the present disclosure.

In one embodiment, another embodiment is illustrated in FIG. 4, which shows a cross-sectional view of the OLED panel according to embodiments of the present disclosure. As shown in FIG. 4, the OLED panel further includes a plurality of metal caps 19. The plurality of metal caps 19 is disposed between the conductive wall 16 and the third electrode layer 18, and the peaks 161 are connected to the third electrode layer 18 through the plurality of metal caps 19.

As shown in FIG. 4, the metal cap 19 is deposited and grown on the conductive wall 16, so that the metal cap 19 can be closely connected to the conductive wall 16 to obtain the reliable electrical connection at the atomic or molecular level. In addition, the third electrode layer 18 is generally made of a metal material or a metal oxide material, and the conductive wall 16 being connected to the third electrode layer 18 through the metal caps 19 can reduce the problem of relatively large contact resistance caused by different chemical and physical properties of surfaces of the conductive wall 16 and the third electrode layer 18.

In one embodiment, still referring to FIG. 3, the OLED panel further includes a color filter layer 201. The color filter layer 201 is disposed on the planarization layer 17 and provided with third openings 202 at positions of the peaks 161, and the peaks 161 are connected to the third electrode layer 18 through the third openings 202.

As shown in FIG. 3, the color filter layer 201 is disposed on a surface of the planarization layer 17 facing away from the substrate 11, so that light emitted by the light-emitting layer is emitted as light of different colors through the color filter layer 201, thereby achieving a color display.

Figure 5:
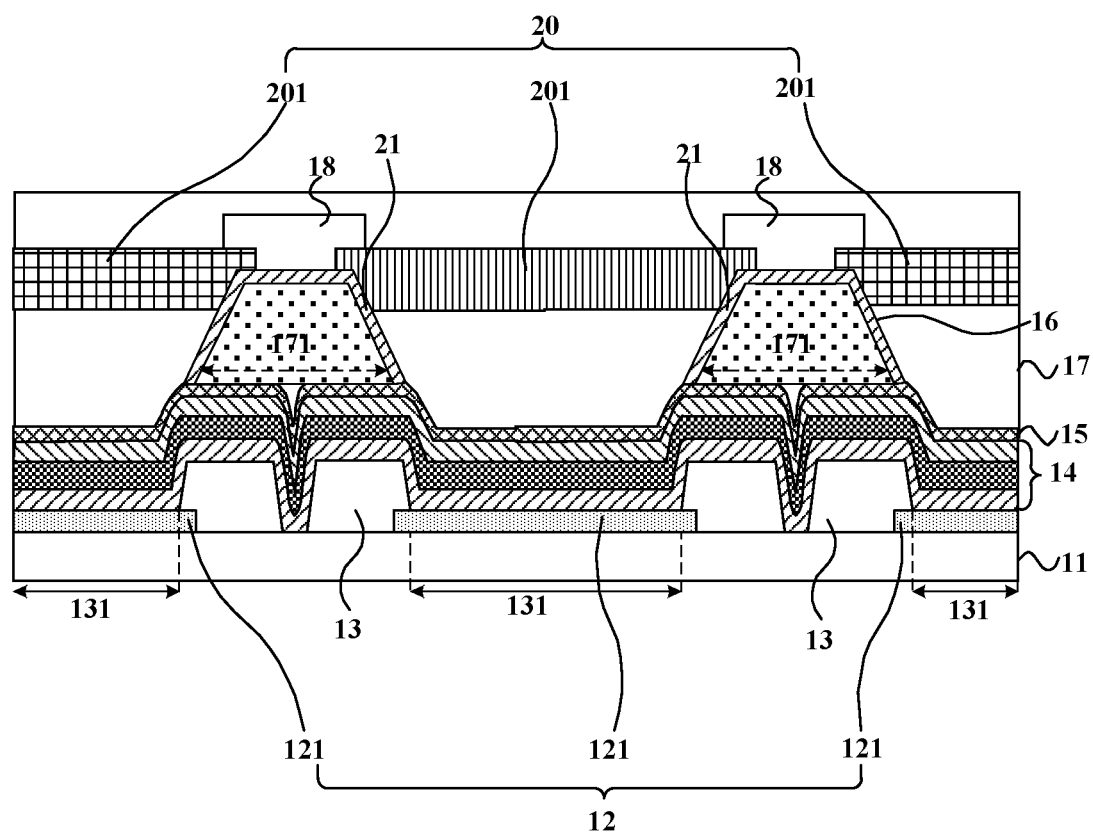
FIG. 5 shows a cross-sectional view of another OLED panel according to embodiments of the present disclosure.

In one embodiment, another embodiment is illustrated in FIG. 5, which shows a cross-sectional view of the OLED panel according to embodiments of the present disclosure. As shown in FIG. 5, the OLED panel further includes a reflective layer 21. The reflective layer 21 covers at least part of a sidewall of the conductive wall 16.

In one embodiment, still referring to FIG. 5, the reflective layer 21 is further disposed between the conductive wall 16 and the third electrode layer 18.

Since the reflective layer 21 is disposed on the sidewall of the conductive wall 16, light emitted by each sub-pixel is restricted in a closed space of the sub-pixel, most of the light is directly emitted upwards, part of light in large angle is reflected one or more times by the reflective layer 21 on the sidewall of the conductive wall 16 and then emitted out. Compared with the case of using an opaque conductive wall 16, light absorbed by the sidewall of the pixel definition layer in this embodiment is negligible, and a loss of light in the sub-pixel is small, that is, almost all light emitted by the light-emitting element of each sub-pixel is reflected out, thereby improving light-emitting efficiency of the OLED panel.

As shown in FIG. 5, the reflective layer 21 is not only disposed on the sidewall of the conductive wall 16 but also formed between the conductive wall 16 and the third electrode layer 18. Due to the existence of the reflective layer 21, the conductive wall 16 itself does not need to absorb the leaked light in large angle; therefore, a material of the conductive wall 16 and a conductive particle mixed therein have more choices, and the conductive wall 16 may be transparent or opaque after mixed with the conductive particle.

Figure 6:
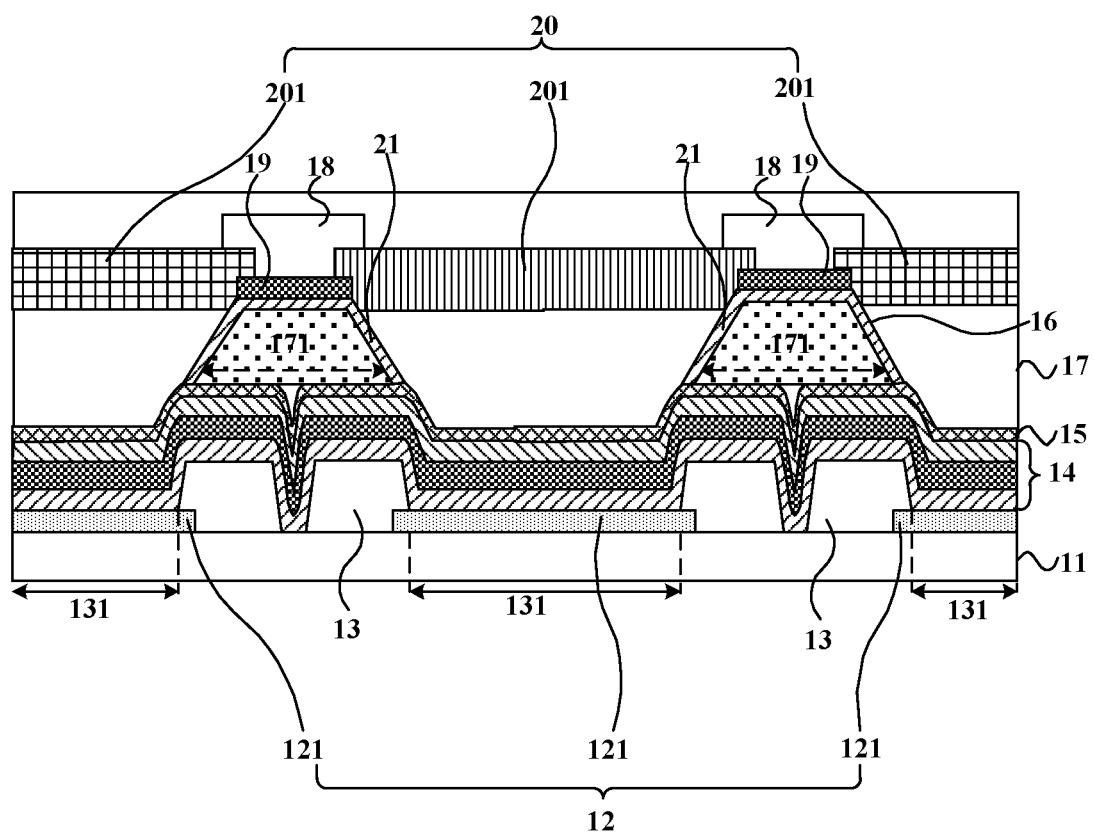
FIG. 6 shows a cross-sectional view of another OLED panel according to embodiments of the present disclosure.
Figure 7:
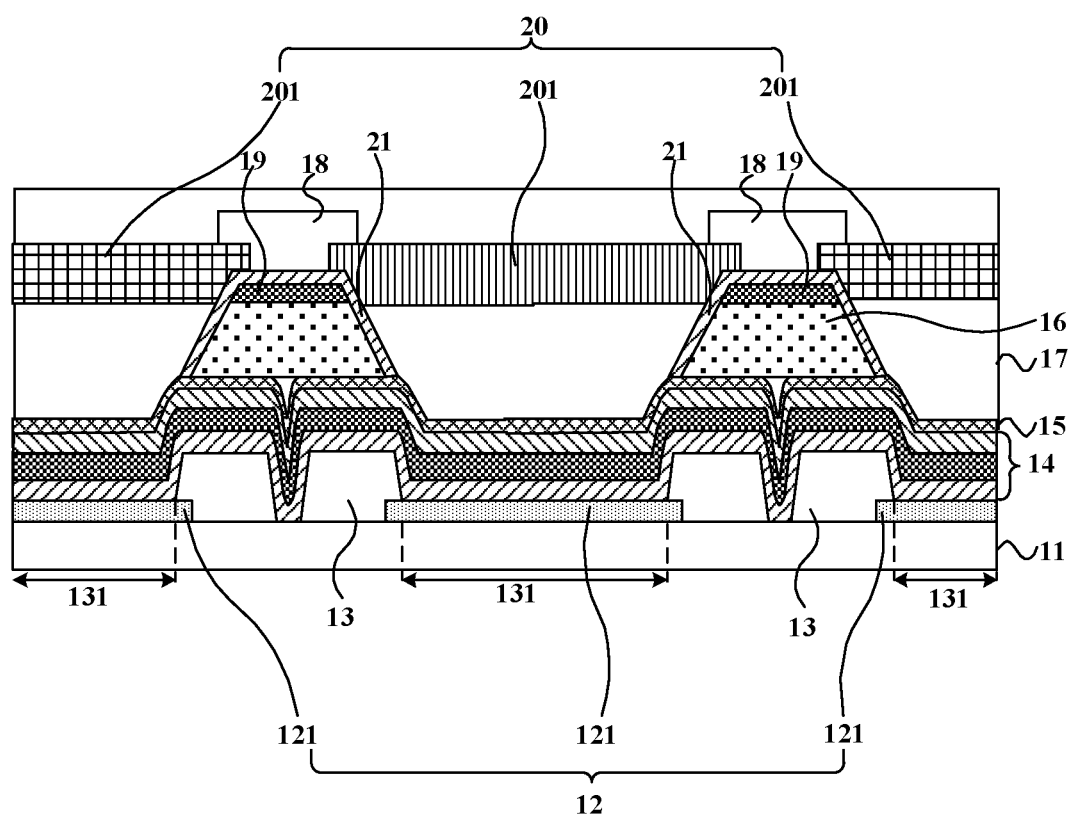
FIG. 7 shows a cross-sectional view of another OLED panel according to embodiments of the present disclosure.

In one embodiment, as shown in FIGS. 6 and 7, the OLED panel further includes the reflective layer. The plurality of metal caps 19 is disposed between the conductive wall 16 and the third electrode layer 18; the reflective layer 21 is disposed on a side of the plurality of metal caps 19 facing towards or facing away from the conductive wall 16; and the reflective layer further covers at least part of the sidewall of the conductive wall. FIG. 6 exemplarily shows that the reflective layer 21 is disposed on the side of the plurality of metal caps 19 facing towards the conductive wall 16. FIG. 7 exemplarily shows that the reflective layer 21 is disposed on the side of the plurality of metal caps 19 facing away from the conductive wall 16.

In one embodiment, a work function difference between the reflective layer 21 and the metal cap 19 is less than 0.5 V.

Referring to FIGS. 6 and 7, the reflective layer 21 may be disposed on the side of the metal caps 19 facing towards the conductive wall 16, or may be disposed on the side of the metal caps 19 facing away from the conductive wall 16. The work function difference between the reflective layer 21 and the metal cap 19 is configured to be less than 0.5 V, which can effectively prevent the metal cap 19 and the reflective layer 21 from having relatively large contact resistance due to a material difference therebetween.

In one embodiment, the conductive wall 16 includes an organic and conductive base material or an organic base material mixed with conductive particles.

The conductive wall 16 is disposed between two adjacent color resists of sub-pixels, so that each sub-pixel can be isolated in an independent closed or semi-closed space. As the organic material has certain elasticity, the conductive wall 16 is selected to include the organic and conductive base material, so that the conductive wall 16 can have vertical elasticity in a direction perpendicular to a second substrate, thereby ensuring good elasticity of the conductive wall 16. Furthermore, the conductivity of the conductive wall 16 is improved by mixing a conductive particle in the conductive wall 16.

In one embodiment, the organic and conductive base material includes a poly ethylene material, a polyvinyl chloride material, a polystyrene material, a polypropylene material, or a resin material.

In one embodiment, the organic material mixed with conductive particles includes a carbon nanoparticle, a carbon nanotube, a graphene particle, a silicon nanoparticle, or a metal nanoparticle.

A high proportion of carbon nanoparticles, carbon nanotubes, graphene particles, silicon nanoparticles, or metal nanoparticles are directly mixed into the organic and conductive base material of the conductive wall 16, so that the conductivity of the conductive wall 16 is improved. Moreover, the organic material mixed with conductive particles can also reduce light transmittance of the conductive wall 16, thereby preventing the problem of light emission crosstalk of light emission in two adjacent sub-pixel regions.

In one embodiment, a volume ratio of the carbon nanoparticle or the carbon nanotube in the conductive wall 16 ranges from 10% to 30%.

The conductive particles are mixed in the conductive wall 16, so that better conductivity and lower light transmittance of the conductive wall 16 are realized. Amount of conductive particles mixed in conductive wall 16 will modulate the physical properties of the conductive wall 16, excessive amount of the conductive particles will result in higher conductivity and lower elasticity, while deficiency in the conductive particles will lead to better elasticity but lower conductivity. It is found through analysis by the inventor, that the volume ratio of the carbon nanoparticles or the carbon nanotubes in the conductive wall 16 ranges from 10% to 30% is preferred, considering a balance among the conductivity, light transmittance, elasticity and manufacturability. For example, when the volume ratio of carbon nanoparticles mixed in poly ethylene (PE) is 10% to 30%, the conductive wall 16 can have higher conductivity and better elasticity. If carbon nanotubes with better conductivity are mixed, a mixing ratio of the carbon nanotubes may be reduced, for example, the volume ratio of the mixed carbon nanotubes is 3% to 6%, and resulting better elasticity and conductivity of the conductive wall 16.

It is to be noted that the organic and conductive base material includes the poly ethylene material, a polyvinyl chloride material, a polystyrene material, a polypropylene material, or a resin material, and may also include other organic materials. The material of the organic and conductive base material is not specifically limited in the embodiments of the present disclosure. The conductive particles mixed in the base material may be the carbon nanoparticle, the carbon nanotube, the graphene particle, the silicon nanoparticle, or the metal nanoparticle, and may also be another particle with conductivity. A property of the material mixed with the conductive particles is not specifically limited in the embodiments of the present disclosure. In a practical design process, the balance between the elasticity and the conductivity of the conductive wall 16 may be comprehensively weighed, so as to select an appropriate organic and conductive base material, and appropriate material and volume ratio of the conductive particle, etc.

In one embodiment, a length of the carbon nanotube is less than 2 urn and a diameter of the carbon nanotube is less than 50 nm.

A thickness of the conductive wall 16 is generally set between 1 micron and 5 microns, so after the volume ratio range of the carbon nanoparticle or the carbon nanotube in the conductive wall 16 is selected, the length of the carbon nanotube is set to be less than 2 urn and the diameter of the carbon nanotube is set to be less than 50 nm, so that it is relatively easy to obtain the conductive wall 16 with a low resistance value while the thickness of the conductive wall 16 is satisfied. Therefore, the manufactured conductive wall 16 has higher conductivity, better elasticity, and smaller resistance, avoiding the impact of too large a resistance value of the conductive wall 16 on the electron transmission from the second electrode layer to the conductive wall 16.

In one embodiment, the conductive wall 16 includes a conductive macromolecule polymer.

Furthermore, the conductive wall 16 may be configured to include the conductive macromolecule polymer. The conductive macromolecule polymer is selected as a main material of the conductive wall 16. On one hand, an electrical connection between the second electrode layer 15 and the third electrode layer 18 can be achieved by using high conductivity of the material itself. On the other hand, when the conductive wall is manufactured by using an etching process, the potential contamination of conductive particles such as carbon powder mixed in the conductive wall when the conductive wall 24 is manufactured can be avoided.

In one embodiment, the conductive wall 16 includes conductive macromolecule polyaniline, polyacetylene, or polybutadiene.

A material like the macromolecule polymer with relatively high conductivity, such as polyaniline, polyacetylene, or polybutadiene, is adopted. In a molecular structure of the type of polyaniline, polyacetylene, or polybutadiene, single bonds and double bonds are alternately arranged between carbon and carbon molecules: —CH=CH—, and π electrons in the double bonds of the carbon molecules are delocalized. The movement of π electrons along a conjugated chain forms a conductive mechanism of the macromolecule polymer. The longer a molecular chain of a conjugated polymer, the greater the number of π electrons, the lower the activation energy of the electrons, and the higher the conductivity.

In one embodiment, the conductive wall 16 further includes the carbon nanoparticle, the carbon nanotube, the graphene particle, the silicon nanoparticle, or the metal nanoparticle.

When the conductive wall 16 is made of the conductive macromolecule polymer, the conductivity of the conductive wall 16 can be further improved by mixing particles such as carbon nanoparticles, carbon nanotubes, graphene particles, silicon nanoparticles, or metal nanoparticles into the conductive wall 16.

In one embodiment, the third electrode layer 18 includes chromium, chromium oxide, or indium tin oxide.

The third electrode layer 18 is disposed on the side of the conductive wall 16 facing away from the substrate 11 and is in contact with the peaks 161 of the conductive wall 16. A material selected for the third electrode layer 18 includes chromium, chromium oxide, or indium tin oxide, which can ensure that the third electrode layer 18 has relatively low reflectivity, prevent the problem that light in an external environment is reflected and visible, and improve the display effect of the OLED panel.

It is to be noted that the third electrode layer 18 may also be made of other conductive material with low reflectivity. The material of the third electrode layer 18 is not specifically limited in the embodiments of the present disclosure.

Figure 8:
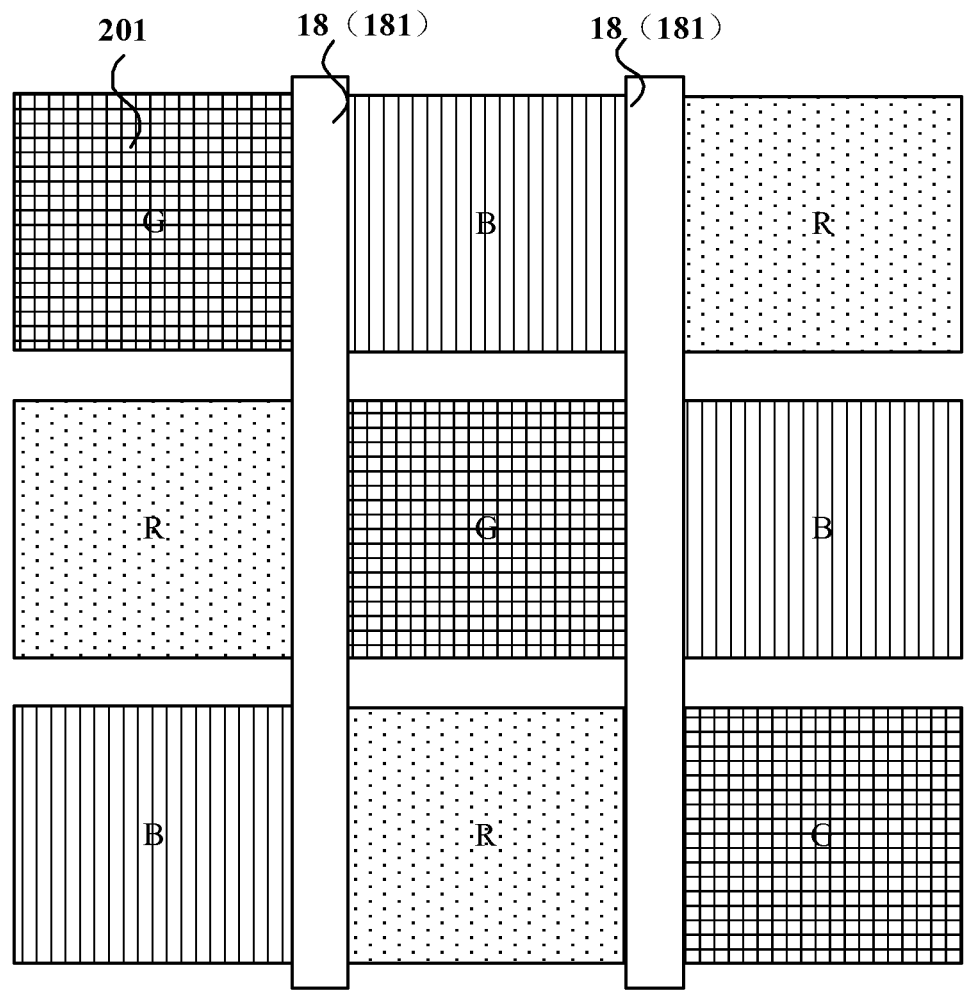
FIG. 8 shows a plane view of another OLED panel according to embodiments of the present disclosure.

In one embodiment, the third electrode layer 18 is in a grid shape, or the third electrode layer 18 includes a plurality of parallel conductive strips. FIG. 1 exemplarily shows that the third electrode layer 18 is in the grid shape. FIG. 8 exemplarily shows that the third electrode layer 18 includes the plurality of parallel conductive strips 181.

A plurality of sub-pixels is defined on the OLED panel by a plurality of scanning lines and a plurality of data lines, the third electrode layer 18 is disposed on a scanning line between adjacent sub-pixels and a data line between adjacent sub-pixels, and the third electrode layer 18 is in the grid shape. In this way, the third electrode layer 18 can block the scanning line between adjacent sub-pixels and the data line between adjacent sub-pixels, avoiding light leakage between adjacent sub-pixels, and improving the display effect of the OLED panel.

Furthermore, the third electrode layer 18 is configured to include the plurality of parallel conductive strips 181. For example, the third electrode layer 18 may include a plurality of conductive strips 181 parallel to the data lines of the OLED panel or a plurality of conductive strips 181 parallel to the scanning lines of the OLED panel. As shown in FIG. 8, FIG. 8 exemplarily shows that the third electrode layer 18 includes the plurality of parallel conductive strips 181. A thickness of the conductive strip is increased, which can save material costs on the premise that a requirement on the conductivity of the third electrode layer 18 is ensured, and requires a simple manufacturing process.

In one embodiment, still referring to FIG. 2, the OLED panel further includes a protective layer 22 disposed on a side of the third electrode layer 18 facing away from the substrate 11.

Figure 9:
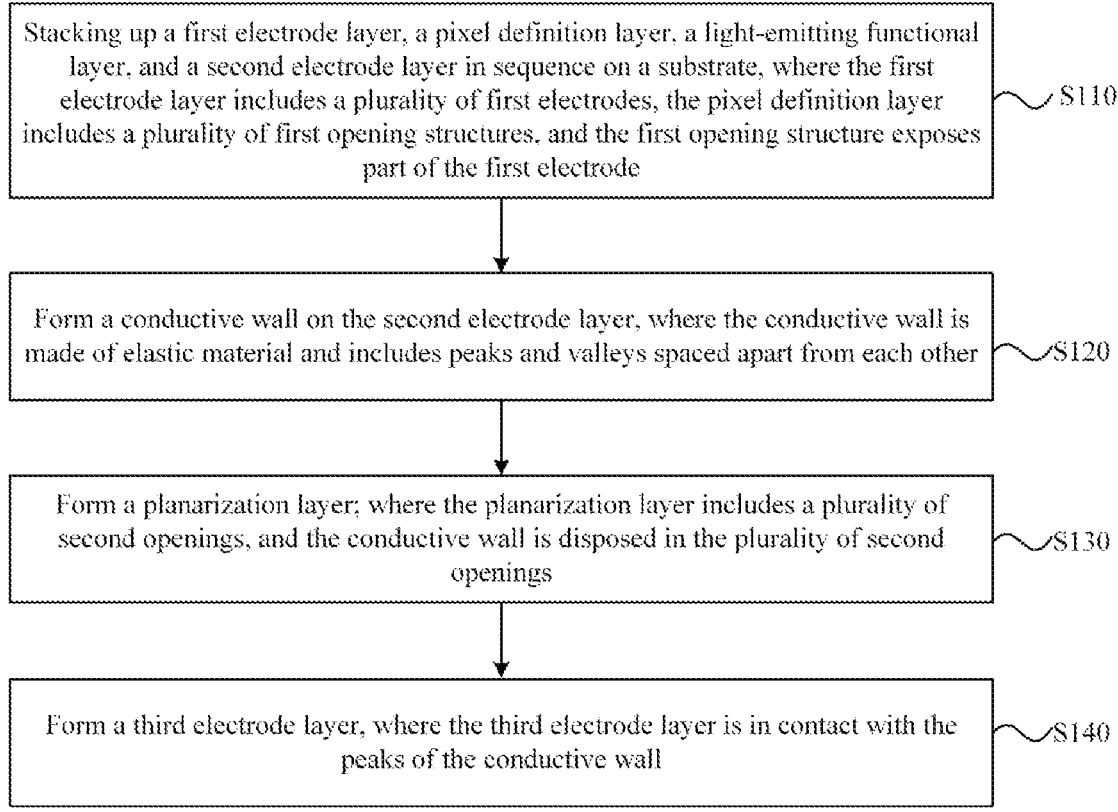
FIG. 9 shows a flowchart illustrating a manufacturing method of an OLED panel according to embodiments of the present disclosure.

Another embodiment of the present disclosure is illustrated in FIG. 9, which shows a flowchart illustrating a manufacturing method of an OLED panel according to embodiments of the present disclosure. As shown in FIG. 9, the manufacturing method of the OLED panel includes steps described below.

In S110, a first electrode layer, a pixel definition layer, a light-emitting layer, and a second electrode layer are stacked up in sequence on a substrate, where the first electrode layer includes a plurality of first electrodes, the pixel definition layer includes a plurality of first opening structures, and the first opening structure exposes part of the first electrode.

In S120, a conductive wall is formed on the second electrode layer, where the conductive wall includes peaks and valleys spaced apart from each other.

In S130, a planarization layer is formed; where the planarization layer includes a plurality of second openings, and the conductive wall is disposed in the plurality of second openings.

In S140, a third electrode layer is formed, where the third electrode layer is in contact with the peaks of the conductive wall.

In conjunction with FIG. 3, a vertical projection of the conductive wall on the substrate and a vertical projection of the third electrode layer on the substrate each overlap a vertical projection of the pixel definition layer on the substrate; and the peak has a height of H1, the valley has a height of H2, and the planarization layer has a height of H3, where $H2<H3<H1$.

According to the manufacturing method of the OLED panel provided by the embodiment of the present disclosure, the first electrode layer, the pixel definition layer, the light-emitting layer, and the second electrode layer are firstly stacked up in sequence on the substrate, where the first electrode layer includes the plurality of first electrodes, the pixel definition layer includes the plurality of first opening structures, and the first opening structure exposes part of the first electrode. Then, a linear coating manner or a spin coating manner is used for coating the conductive wall with a thickness of not less than 1 micron on a surface of the second electrode layer facing away from the substrate, where the conductive wall includes the peaks and the valleys. After a coating process is completed, thermal baking or UV curing process is performed in a baking oven at a temperature not lower than 110° C., or an organic film hardening process with equal emphases on thermal baking and UV is performed. After the conductive wall is formed, to avoid multiple reflections of light emitted from the OLED panel between different films and an impact of residual gases on the different films of the OLED panel, the linear coating is used for coating a liquid containing an organic material on the completed conductive wall after the conductive wall is formed, and the planarization layer is formed after baking and molding. Finally, the third electrode layer is formed on a side of the conductive wall facing away from the substrate, where the third electrode layer is in contact with the peaks of the conductive wall. The vertical projection of the conductive wall on the substrate and the vertical projection of the third electrode layer on the substrate each overlap the vertical projection of the pixel definition layer on the substrate; and the peak has a height of H1, the valley has a height of H2, and the planarization layer has a height of H3, where $H2<H3<H1$.

After the conductive wall is formed, the planarization layer is formed in a coating manner. The planarization layer in a liquid state before its solidification can laterally flow between adjacent sub-pixels through the valley, so that a surface of the planarization layer facing away from the substrate is smooth at positions of adjacent sub-pixels.

Furthermore, when a height difference between the valley and the peak of the conductive wall is too large, the light in large oblique angle tends to pass through a gap between the valley and the peak, and then reaches to an adjacent sub-pixel, resulting in optical crosstalk and color mixing. On the other hand, when the height difference between the valley and the peak of the conductive wall is too small, lateral circulation of an airflow during sealing process will be obstructed notably. To reduce the complexity of a manufacturing process and ensure enough elasticity of the conductive wall, the height H1 of the peak and a height H2 of the valley are preferred to satisfy $0.3<H2/H1<0.7$, and a length L1 of the peak and a length L2 of the valley are preferred to satisfy $1<L2/L1<10$.

After the conductive wall is formed, the planarization layer and a color filter layer need to be formed. In a process of forming the planarization layer or the color filter layer, some impurities will be deposited on a surface of the conductive wall facing away from the substrate, affecting the electrical contact between the conductive wall and the third electrode layer. Therefore, after the planarization layer and the color filter layer are formed on the conductive wall, etching or other manners are used for etching the surface of the conductive wall facing away from the substrate to remove residuals deposited on the surface of the conductive wall facing away from the substrate and improve the electrical contact between the conductive wall and the third electrode layer.

In the manufacturing method of the OLED panel in the embodiments of the present disclosure, the first electrode layer, the pixel definition layer, the light-emitting layer, the second electrode layer, the conductive wall, the planarization layer, and the third electrode layer are stacked up in sequence on the substrate, the planarization layer includes the plurality of second openings, the conductive wall is disposed in the plurality of second openings, and the second electrode layer is electrically connected to the third electrode layer through the conductive wall. On one hand, the problem of excessive resistance of the second electrode layer since the second electrode layer is relatively thin can be solved. On the other hand, if the second electrode layer breaks at a position of the pixel definition layer, the second electrode layer may also be electrically connected to the third electrode layer through the conductive wall, which can also avoid the problem that a voltage drop at a breakage position of the second electrode layer increases which affects light-emitting efficiency and uniformity. The planarization layer is formed on the conductive wall in the coating manner. The planarization layer in the liquid state before its solidification can laterally flow between adjacent sub-pixels through the valley, so that the surface of the planarization layer facing away from the substrate is smooth at positions of different adjacent sub-pixels. The OLED panel provided by the embodiments of the present disclosure has an integrated display panel structure, that is, film structures of the OLED panel are stacked up in sequence on one side of the substrate, and there is no need to align two substrates for encapsulation, so that a second electrode can be closely connected to the conductive wall to obtain a reliable electrical connection at an atomic or molecular level.

In one embodiment, after the planarization layer is formed, the manufacturing method further includes forming the color filter layer, where the color filter layer is provided with third openings at positions of the peaks, and the peaks are connected to the third electrode layer through the third openings.

It is to be noted that after the planarization layer is formed, photosensitive resin mixed with red, green, and blue dyes is made with three procedures into an array of color resists of pixels of R, G, and B colors on the planarization layer, and the formed color filter layer is provided with the third openings at the positions of the peaks, where the peaks are connected to the third electrode layer through the third openings.

The above detailed descriptions of the embodiments of the present invention set forth preferred modes contemplated by the inventors for carrying out the present invention at the time of filing this application, and are provided by way of examples and not as limitations. Accordingly, various modifications and variations obvious to a person of ordinary skill in the art to which it pertains are deemed to lie within the scope and spirit of the present invention as set forth in the following claims.

What is claimed is:

1. An organic light-emitting display (OLED) panel, comprising:
   a substrate,
   a first electrode layer disposed on the substrate and comprising a plurality of first electrodes;
   a pixel definition layer disposed on a side of the first electrode layer facing away from the substrate and comprising a plurality of first openings, wherein each of the plurality of first openings exposes part of a respective one of the plurality of first electrodes;
   a light-emitting layer disposed on a side of the plurality of first electrodes facing away from the substrate;
   a second electrode layer disposed on a side of the light-emitting layer facing away from the substrate;
   a conductive wall made of an elastic material and comprising peaks and valleys spaced apart from each other;
   a planarization layer disposed on a surface of the second electrode layer facing away from the substrate and comprising a plurality of second openings; wherein the conductive wall is disposed in the plurality of second openings; and
   a third electrode layer disposed on a side of the conductive wall facing away from the substrate and in contact with the peaks;
   wherein each of the peaks has a height of H1, each of the valleys has a height of H2, and the planarization layer has a height of H3, wherein H2<H3<H1; and a vertical projection of the conductive wall on the substrate and a vertical projection of the third electrode layer on the substrate each overlap a vertical projection of the pixel definition layer on the substrate.

2. The OLED panel according to claim 1, further comprising a plurality of metal caps disposed between the conductive wall and the third electrode layer; wherein the peaks are connected to the third electrode layer through the plurality of metal caps.

3. The OLED panel according to claim 1, further comprising a color filter layer disposed on the planarization layer and provided with third openings at positions of the peaks, wherein the peaks are connected to the third electrode layer through the third openings.

4. The OLED panel according to claim 1, further comprising a reflective layer covering at least part of a sidewall of the conductive wall.

5. The OLED panel according to claim 4, wherein the reflective layer is further disposed between the conductive wall and the third electrode layer.

6. The OLED panel according to claim 2, further comprising a reflective layer; wherein the plurality of metal caps is disposed between the conductive wall and the third electrode layer; the reflective layer is disposed on a side of the plurality of metal caps facing towards or facing away from the conductive wall; and the reflective layer further covers at least part of a sidewall of the conductive wall.

7. The OLED panel according to claim 6, wherein a working function difference between the reflective layer and each of the plurality of metal caps is less than 0.5 V.

8. The OLED panel according to claim 1, wherein the conductive wall comprises an organic and conductive base material or an organic base material mixed with conductive particles.

9. The OLED panel according to claim 8, wherein the organic and conductive base material comprises a poly ethylene material, a polyvinyl chloride material, a polystyrene material, a polypropylene material, or a resin material.

10. The OLED panel according to claim 9, wherein the conductive particles mixed in the organic base material comprises at least one of the following materials: a carbon nanoparticle, a carbon nanotube, a graphene particle, a silicon nanoparticle, and a metal nanoparticle.

11. The OLED panel according to claim 10, wherein a volume ratio of the carbon nanoparticle or the carbon nanotube in the conductive wall ranges from 10% to 30%.

12. The OLED panel according to claim 10, wherein a length of the carbon nanotube is less than 2 urn and a diameter of the carbon nanotube is less than 50 nm.

13. The OLED panel according to claim 1, wherein the conductive wall comprises a conductive macromolecule polymer.

14. The OLED panel according to claim 13, wherein the conductive wall comprises at least one of the followings: conductive macromolecule polyaniline, polyacetylene, and polybutadiene.

15. The OLED panel according to claim 14, wherein the conductive wall further comprises at least one of the followings: carbon nanoparticle, carbon nanotube, graphene particle, silicon nanoparticle, and metal nanoparticle.

16. The OLED panel according to claim 1, wherein the third electrode layer comprises chromium, chromium oxide, or indium tin oxide.

17. The OLED panel of claim 1, wherein the third electrode layer is in a grid shape; or the third electrode layer comprises a plurality of parallel conductive strips.

18. A manufacturing method of an organic light-emitting display (OLED) panel, comprising:
   stacking up a first electrode layer, a pixel definition layer, a light-emitting layer, and a second electrode layer in sequence on a substrate, wherein the first electrode layer comprises a plurality of first electrodes, the pixel definition layer comprises a plurality of first opening structures, and each of the plurality of first opening structures exposes part of a respective one of the plurality of first electrodes;

forming a conductive wall on the second electrode layer, wherein the conductive wall is made of an elastic material and comprises peaks and valleys spaced apart from each other;

forming a planarization layer; wherein the planarization layer comprises a plurality of second openings, and the conductive wall is disposed in the plurality of second openings; and forming a third electrode layer, wherein the third electrode layer is in contact with the peaks of the conductive wall;

wherein a vertical projection of the conductive wall on the substrate and a vertical projection of the third electrode layer on the substrate each overlap a vertical projection of the pixel definition layer on the substrate; and each of the peaks has a height of H1, each of the valleys has a height of H2, and the planarization layer has a height of H3, wherein $H2<H3<H1$.

19. The manufacturing method according to claim 18, after forming the planarization layer, further comprising:

forming a color filter layer, wherein the color filter layer is provided with third openings at positions of the peaks, and the peaks are connected to the third electrode layer through the third openings.

* * * * *